United States Patent
Sun et al.

(10) Patent No.: US 10,169,524 B2
(45) Date of Patent: Jan. 1, 2019

(54) UNIVERSAL CELL MODEL FOR ARRAY AND CIRCUIT SIMULATION USING THE SAME

(71) Applicant: TAIWAN SEMICONDUCTOR MANUFACTURING COMPANY LTD., Hsinchu (TW)

(72) Inventors: Lin Sun, Shanghai (CN); Tingting Lu, Songjiang District (CN); Weiyang Jiang, Zhejiang (CN); Feng Zhu, Shanghai (CN); Zhi Zhong Hu, Shanghai (CN); Mu-Jen Huang, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/062,924

(22) Filed: Mar. 7, 2016

(65) Prior Publication Data
US 2016/0292347 A1 Oct. 6, 2016

(30) Foreign Application Priority Data

Apr. 2, 2015 (CN) .......................... 2015 1 0154658

(51) Int. Cl.
*G06F 17/50* (2006.01)
(52) U.S. Cl.
CPC ...... *G06F 17/5081* (2013.01); *G06F 17/5036* (2013.01)

(58) Field of Classification Search
CPC .................. G06F 17/5036; G06F 17/5081
See application file for complete search history.

(56) References Cited

U.S. PATENT DOCUMENTS 5,666,288 A * 9/1997 Jones .................... G06F 17/505
716/104
5,737,236 A * 4/1998 Maziasz .............. G06F 17/5068
716/123

(Continued)

FOREIGN PATENT DOCUMENTS

CN 103530484 A 11/2013

OTHER PUBLICATIONS

Office Action and Search Report dated Sep. 30, 2018 issued by the China National Intellectual Property Office (CNIPA) for counterpart application No. 201510154658.2.

*Primary Examiner* — Helen Rossoshek
(74) *Attorney, Agent, or Firm* — WPAT, P.C., Intellectual Property Attorneys; Anthony King

(57) ABSTRACT

In some embodiments, in a method, for each array of at least a first array, a layout of the first array which comprises a plurality of cells, and a plurality of first circuit paths running across at least one side length in an array size configuration of the first array is received. Each of the plurality of cells is configured with a first node that is coupled to a respective one of the plurality of first circuit paths. A first representative characteristic associated with the plurality of first circuit paths is extracted. A universal cell model applied to each cell in a second array is generated based on a base cell model comprising parameters independent of positions in the second array, and the first representative characteristic.

20 Claims, 15 Drawing Sheets

(56) References Cited

U.S. PATENT DOCUMENTS

| | | | | |
|---|---|---|---|---|
| 5,818,727 A * | 10/1998 | Sekiguchi | ............ | G06F 17/5072 |
| | | | | 716/113 |
| 6,230,299 B1 * | 5/2001 | McSherry | ............ | G06F 17/5081 |
| | | | | 716/115 |
| 6,574,786 B1 * | 6/2003 | Pohlenz | .............. | G06F 17/5068 |
| | | | | 716/112 |
| 7,215,563 B2 * | 5/2007 | Brandon | ............. | G11C 11/5692 |
| | | | | 257/E21.67 |
| 7,962,872 B2 * | 6/2011 | Koithyar | ............. | G06F 17/5031 |
| | | | | 716/100 |
| 7,979,829 B2 * | 7/2011 | Smayling | ............ | G06F 17/5081 |
| | | | | 716/119 |
| 8,450,778 B2 * | 5/2013 | Chang | .................... | G11C 11/412 |
| | | | | 257/207 |
| 8,531,881 B2 * | 9/2013 | Widjaja | ................. | G11C 11/404 |
| | | | | 365/185.08 |
| 9,218,872 B1 * | 12/2015 | Liaw | ...................... | G11C 11/412 |
| 2002/0167042 A1 * | 11/2002 | Angle | ................ | G06F 17/5068 |
| | | | | 257/315 |
| 2009/0006815 A1 * | 1/2009 | Loubier | ................... | G05B 9/02 |
| | | | | 712/208 |
| 2010/0211724 A1 * | 8/2010 | Weingarten | ......... | G11C 11/5642 |
| | | | | 711/103 |
| 2013/0119452 A1 * | 5/2013 | Endoh | ................ | G11C 16/0425 |
| | | | | 257/316 |
| 2014/0126290 A1 * | 5/2014 | Sakui | ................. | H01L 29/7889 |
| | | | | 365/185.05 |
| 2015/0100935 A1 * | 4/2015 | Lin | ...................... | G06F 17/5081 |
| | | | | 716/111 |
| 2017/0242949 A1 * | 8/2017 | Schindler | ............ | G06F 17/5036 |

* cited by examiner

UNIVERSAL CELL MODEL FOR ARRAY AND CIRCUIT SIMULATION USING THE SAME

PRIORITY CLAIM AND CROSS-REFERENCE

This application claims priority to CN. application Ser. No. 20150154658.2 filed on 2015 Apr. 2, the disclosure of which is hereby incorporated by reference in its entirety.

BACKGROUND

As technology progresses, integrated circuits, such as memory arrays, pixel arrays and so on, have become ever denser and ever smaller. As the arrays incorporate devices of smaller feature sizes, effects of parasitic capacitance, cross coupling capacitance, resistance, and/or inductance from the physical implementation of the devices and/or interconnections of the devices are more pronounced. To simulate behaviors of a physically implemented array, parasitic extraction is performed on a layout of the array and post layout simulation is performed on a netlist of the array back-annotated with the parasitic information.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
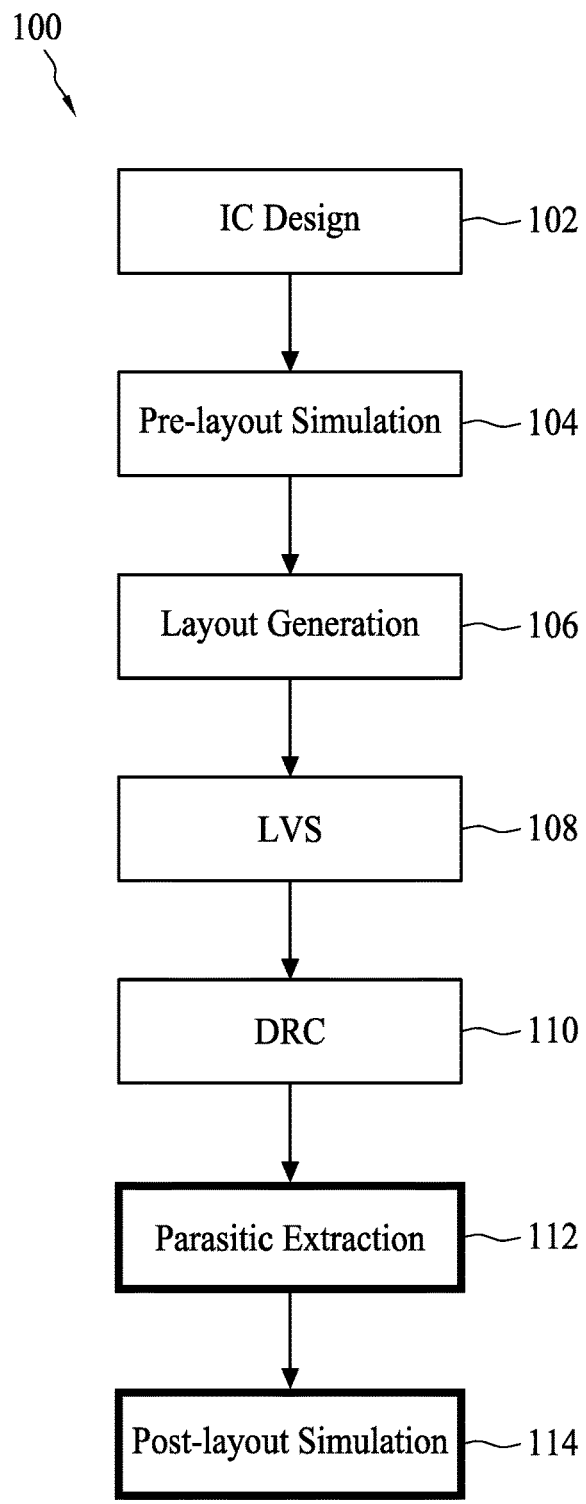
FIG. 1 is a flow diagram of at least a portion of a design flow of an integrated circuit chip in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top", "bottom", "front", "back", "left", "right", "horizontal", "vertical" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a flow diagram of at least a portion of a design flow 100 of an integrated circuit (IC) chip in accordance with some embodiments. The design flow 100 utilizes one or more electronic design automation (EDA) tools to carry out one or more stages in the design flow 100.

At an IC design stage 102, a design of the IC chip is provided by a circuit designer. The design of the IC chip includes one or more circuit blocks and connectivities described by a pre-layout netlist. The pre-layout netlist does not include information regarding the physical implementation of the circuits and thus would not include information regarding sizing, spacing, and placement of the elements of the circuits as well as parasitic elements such as parasitic capacitors and parasitic resistors that arise due to the physical implementation. The term "netlist" used herein refers to both a circuit described graphically in a schematic and/or described textually.

At a pre-layout simulation stage 104, a pre-layout simulation is performed using the pre-layout netlist to determine if the design meets a predetermined specification. If the design does not meet the predetermined specification, the IC chip is redesigned.

At a layout generation stage 106, a layout of the IC chip is generated based on the design. In some embodiments, for standard cell designs, full custom layouts are created for cells, and the layout of the IC chip is generated by an automatic place-and-route tool using the cell layouts. In other embodiments, a full custom layout is created for the entire design. In still other embodiments, the layout of IC chip includes both a full-custom part and an automatically generated part.

At a layout versus schematic (LVS) stage 108, an LVS check is performed to ensure the generated layout correspond to the design. An LVS tool recognizes circuit elements and connections therebetween from patterns in the generated layout, and produces a post-layout netlist representing the recognized circuit elements and connections. The LVS tool then checks whether the post-layout netlist generated from the layout is equivalent to the pre-layout netlist generated from the design. If equivalence is not attained, the design flow 100 returns to the IC design stage 102 and/or the layout generation stage 106 to make correction.

At a design rule check (DRC) stage 110, a DRC check is performed on the layout to ensure that the layout satisfies certain manufacturing design rules such as the minimum width of a pattern in the layout, a minimum spacing between adjacent patterns in the layout, and a minimum area of a pattern in the layout. If one or more design rules is violated, correction is made to at least one of the layout or the design by returning to the IC design stage 102 or the layout generation stage 106.

At a parasitic extraction stage 112, parasitic elements, such as parasitic resistance and parasitic capacitance of interconnects in the layout, are determined and back-annotated in the post-layout netlist. Some embodiments of the present disclosure are applied in this stage. For example, parasitic extraction of a larger array is substituted by parasitic extraction of smaller arrays expanded by principle component extraction and extrapolation.

At a post-layout simulation stage 114, a post-layout simulation is performed on the post-layout netlist to determine the layout meets a predetermined specification. If the simulation indicates that the layout does not meet the predetermined specification, optimization is made to at least one of the design or the layout by returning to the IC design stage 102 or the layout generation stage 106. Otherwise, the layout is passed to additional verification process for signoff. For example, the post-layout simulation is a SPICE (Simulation Program with Integrated Circuit Emphasis) simulation. Some embodiments of the present disclosure are applied in this stage. For example, post layout simulation that applies different cell models with different parasitic extraction result in different positions in the array is substituted by a semi-post layout simulation that applies a universal cell model to the cells in all positions of the array.

The design flow 100 in FIG. 1 is exemplary. Other sequence of the stages, or partition of the stages, and/or additional stages before, between or after the stages shown are within the applicable scope of the present disclosure.

Figure 2:
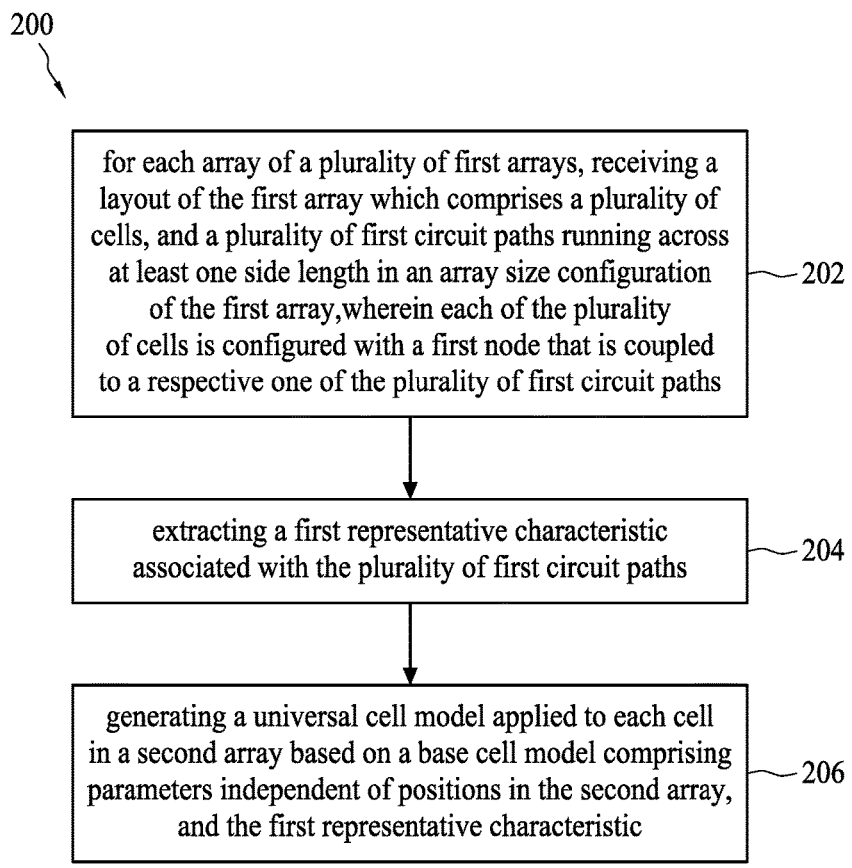
FIG. 2 is a flow diagram of a method for generating a universal cell model for performing a semi-post layout simulation on an array in accordance with some embodiments.

FIG. 2 is a flow diagram of a method 200 for generating a universal cell model for performing a semi-post layout simulation on an array in accordance with some embodiments. In operation 202, for each array of a plurality of first arrays, a layout of the first array which comprises a plurality of cells, and a plurality of first circuit paths running across at least one side length in an array size configuration of the first array is received. Each of the plurality of cells is configured with a first node that is coupled to a respective one of the plurality of first circuit paths. In operation 204, a first representative characteristic associated with the plurality of first circuit paths is extracted. In operation 206, a universal cell model applied to each cell in a second array is generated based on a base cell model comprising parameters independent of positions in the second array, and the first representative characteristic. The second array has an array size configuration the same as or different from the array size configuration of the first array. In some embodiments, the operations 202 and 204 are performed in the parasitic extraction stage 112 in FIG. 1 and the operation 206 is performed in the post layout simulation stage 114 in FIG. 1.

Figure 3:
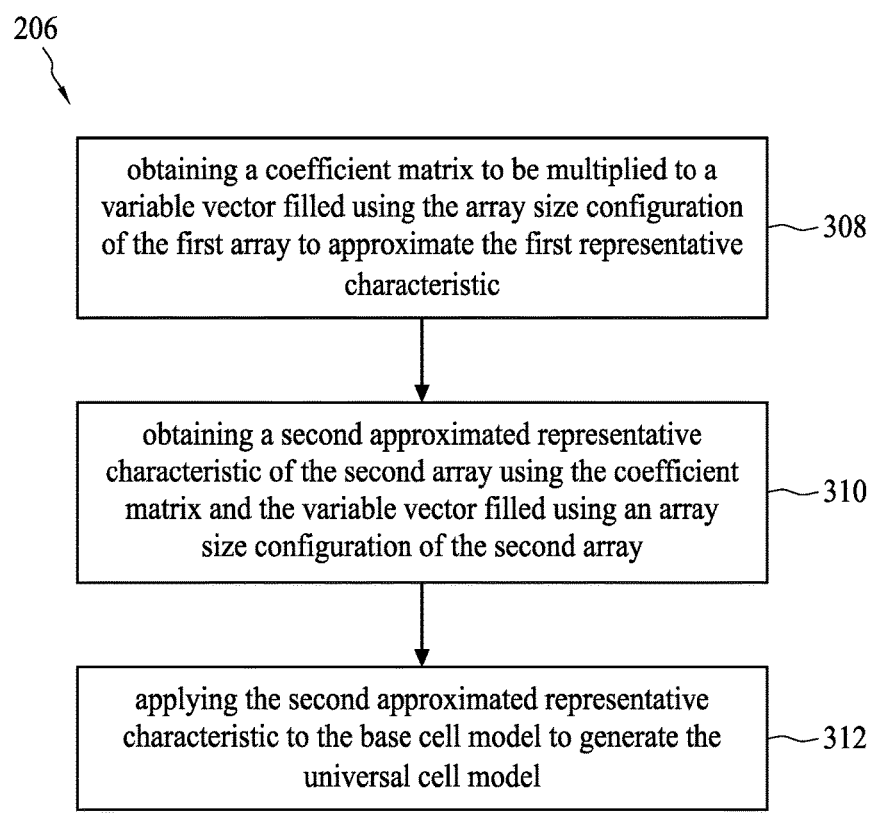
FIG. 3 is a flow diagram of a method for performing an operation in FIG. 2 in accordance with some embodiments.

FIG. 3 is a flow diagram of a method 206 for performing the operation 206 in FIG. 2 in accordance with some embodiments. In some embodiments, the operation 206 in FIG. 2 comprises the operations 308, 310 and 312 in FIG. 3. In operation 308, a coefficient matrix to be multiplied to a variable vector filled using the array size configuration of the first array to approximate the first representative characteristic is obtained. In operation 310, a second approximated representative characteristic of the second array is obtained using the coefficient matrix and the variable vector filled using an array size configuration of the second array. The array size configuration of the second array is different from that of the first array. In operation 312, the second approximated representative characteristic is applied to the base cell model to generate the universal cell model.

Figure 4:
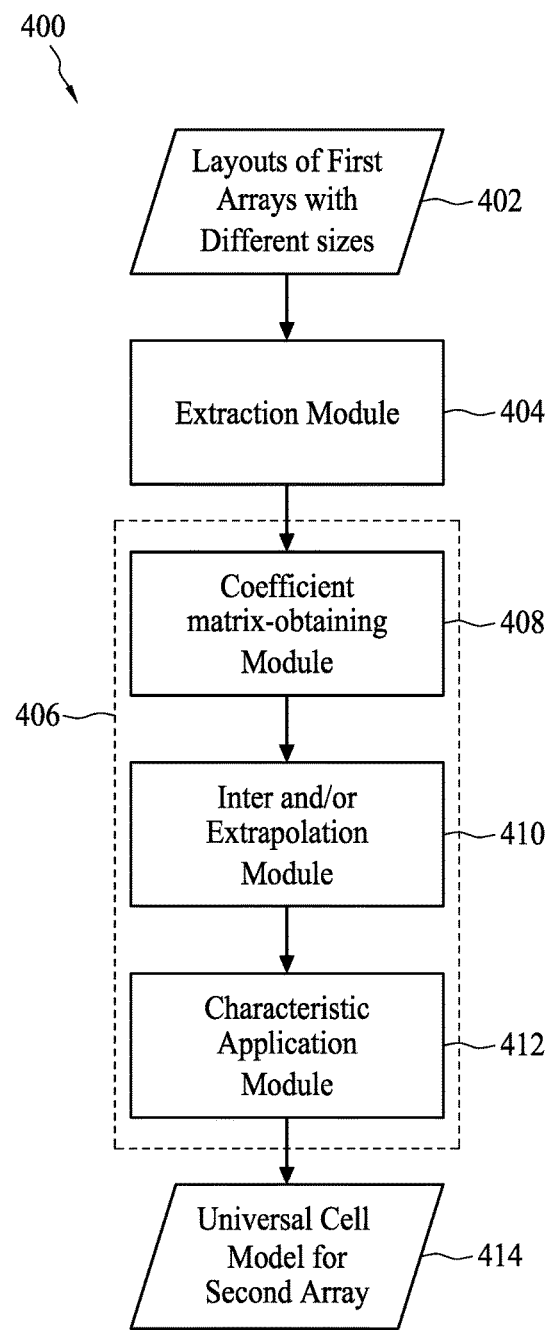
FIG. 4 is a functional block diagram of a software system for generating a universal cell model for performing a semi-post layout simulation on an array in accordance with some embodiments.

FIG. 4 is a functional block diagram of a software system 400 for generating a universal cell model 414 for performing a semi-post layout simulation on an array in accordance with some embodiments. The software system 400 comprises an extraction module 404, and a universal cell model-generating module 406. The extraction module 404 is configured to receive layouts 402 of first arrays with different sizes. Each of the first arrays comprises a plurality of cells, and a plurality of first circuit paths running across at least one side length in an array size configuration of the first array. Each of the plurality of cells being configured with a first node that is coupled to a respective one of the plurality of first circuit paths. The extraction module 404 is further configured to extract a first representative characteristic associated with the plurality of first circuit paths. The universal cell model-generating is configured to generate a universal cell model 414 applied to each cell in a second array based on a base cell model and the first representative characteristic. The base cell model comprises parameters independent of positions in the second array. The second array has an array size configuration the same as or different from that of the first array.

In some embodiments, the universal cell model-generating module 406 comprises a coefficient matrix-obtaining module 408, an inter and/or extrapolation module 410 and a characteristic application module 412. The coefficient matrix-obtaining module 408 is configured to obtain a coefficient matrix to be multiplied to a variable vector filled using the array size configuration of the first array to approximate the first representative characteristic. The inter and/or extrapolation module is configured to obtain a second approximated representative characteristic of the second array using the coefficient matrix and the variable vector filled using the array size configuration of the second array. The array size configuration of the second array is different from that of the first array. The characteristic application module is configured to apply the second approximated representative characteristic to the base cell model to generate the universal cell model 414.

The data or modules described with reference to FIG. 4 have similar reference numerals as the operations described with reference to FIGS. 2 and 3 that are associated with the data or modules. For example, the data 402 in FIG. 4 is associated with the operation 202 in FIG. 2. The module 404 is associated with the operation 204 in FIG. 2. In the following, further details with respect to the operations in FIGS. 2 and 3 are provided. These further details are also applicable to data or modules described with reference to FIG. 4.

Figure 5:
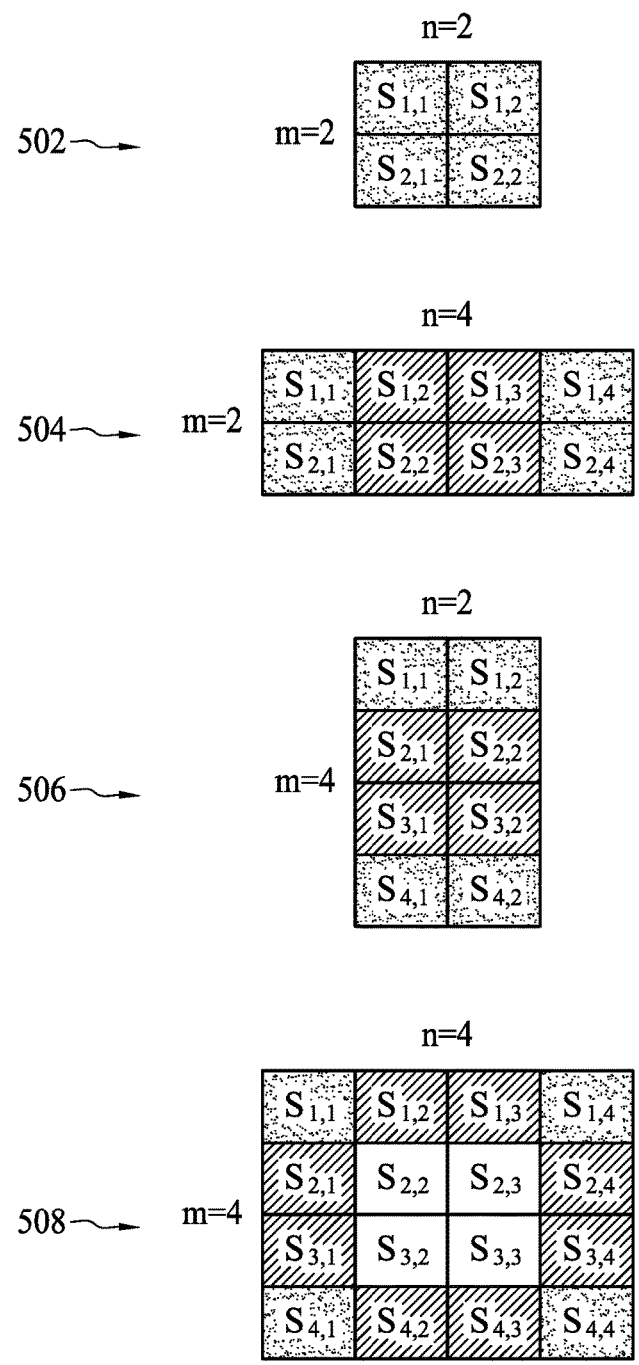
FIG. 5 is a schematic diagram of layouts of a plurality of first arrays in accordance with some embodiments.

In operation 202, for each array of a plurality of first arrays, a layout of the first array which comprises a plurality of cells, and a plurality of first circuit paths running across at least one side length in an array size configuration of the first array is received. Each of the plurality of cells is configured with a first node that is coupled to a respective one of the plurality of first circuit paths. FIG. 5 is a schematic diagram of the layouts 502, 504, 506 and 508 of the plurality of first arrays $A_1$, $A_2$, $A_3$ and $A_4$ (not labeled in figures) in accordance with some embodiments. For simplicity, details within each cell are not shown in this figure. The first arrays $A_1$, $A_2$, $A_3$ and $A_4$ have different array sizes configurations m×n, where m represents a vertical side length (i.e. number of rows), and n represents a horizontal side length (i.e. number of columns). In some embodiments, an array size configuration includes a vertical side length and a horizontal side length. As shown by the layout 502, the first array $A_1$ has the vertical side length m of 2 and the horizontal side length n of 2, and includes cells $S_{1,1}$, $S_{1,2}$ ... and $S_{2,2}$. As shown by the layout 504, the first array $A_2$ has the vertical side length m of 2 and the horizontal side length n of 4, and includes cells $S_{1,1}$, $S_{1,2}$ ... and $S_{2,4}$. As shown by the layout 506, the first array $A_3$ has the vertical side length m of 4 and the horizontal side length n of 2, and includes cells $S_{1,1}$, $S_{1,2}$ ... and $S_{4,2}$. As shown by the layout 508, the first array $A_4$ has the vertical side length m of 4 and the horizontal side length n of 4, and includes cells $S_{1,1}$, $S_{1,2}$ ... and $S_{4,4}$.

In FIG. 5, four first arrays $A_1$, $A_2$, $A_3$ and $A_4$ of different sizes are received. Other number and other sizes of the first arrays are within the contemplated scope of the present disclosure.

Figure 6A:
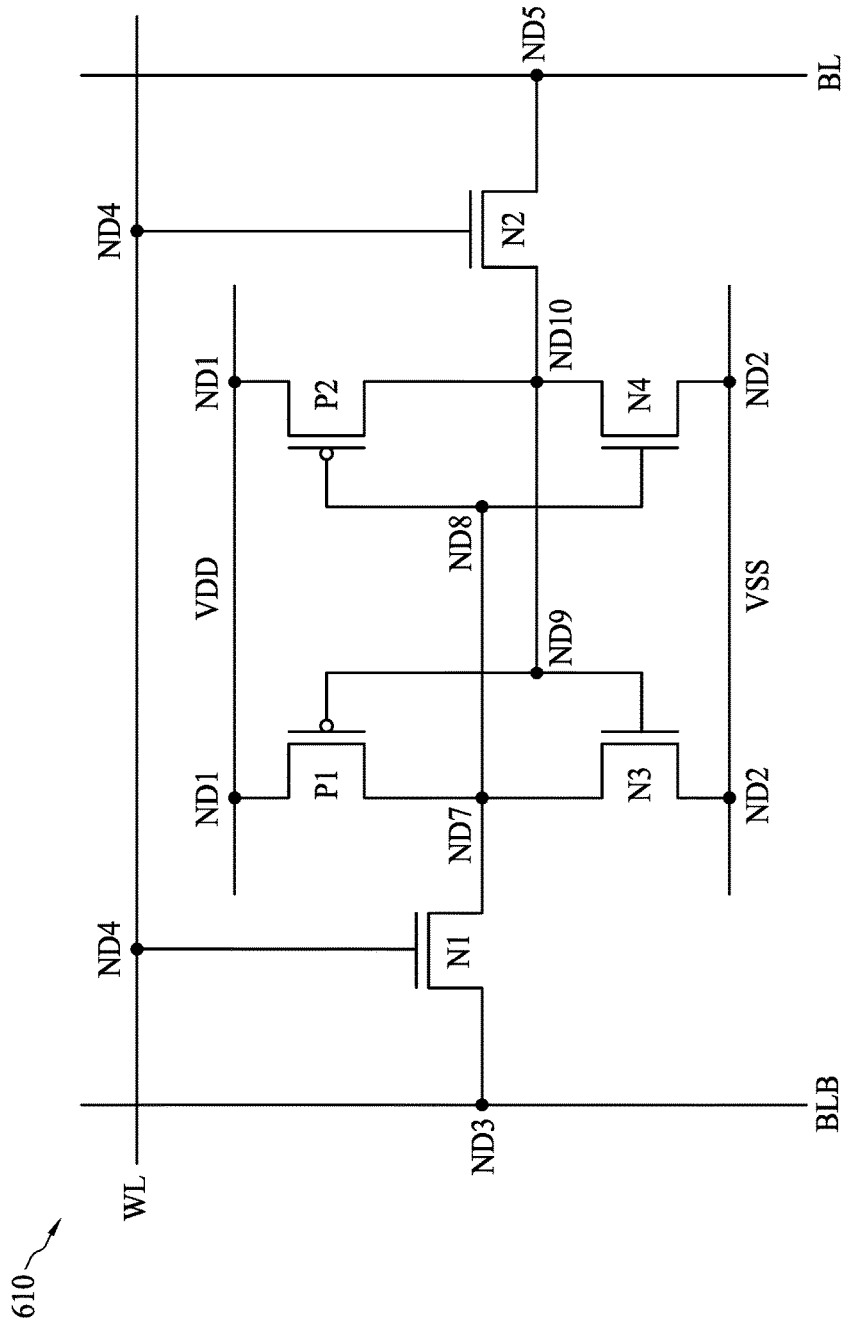
FIG. 6A is a diagram of a cell schematic of any cell in the first arrays in accordance with some embodiments.

FIG. 6A is a diagram of a cell schematic 610 of any cell $S_{i,j}$ in the first arrays $A_1$, $A_2$, $A_3$ and $A_4$ in accordance with some embodiments. In some embodiments, the first arrays are static random access memory (SRAM) arrays. Each cell $S_{i,j}$ is a 6T SRAM cell. SRAM arrays are used as examples in the present disclosure. Other types of arrays, such as DRAM arrays, pixel arrays are within the contemplated scope of the present disclosure. In the cell schematic 610, the cell $S_{i,j}$ includes a pair of cross-coupled inverters and access transistors. A first inverter of the pair of cross-coupled inverters includes a PMOS P1 and an NMOS N3. A second inverter of the pair of cross-coupled inverters includes a PMOS P2 and an NMOS N4. The access transistors include an NMOS N1 and an NMOS N2. Sources of the PMOSs P1 and P2 are coupled to the positive power supply VDD. A gate of the PMOS P1 is coupled to a drain of the PMOS P2 which is also coupled to a first source or drain of the NMOS N2. A gate of the PMOS P2 is coupled to a drain of the PMOS P1 which is also coupled to a first source or drain of the NMOS N1. Sources of the NMOSs N3 and N4 are coupled to the negative power supply VSS. A gate of the NMOS N3 is coupled to a drain of the NMOS N4 which is also coupled to the first source or drain of the NMOS N2. A gate of the NMOS N4 is coupled to a drain of the NMOS N3 which is also coupled to the first source or drain of the NMOS N1. The gates of the NMOSs N1 and N2 are coupled to a word line WL. A second source or drain of the NMOS N1 and a second source or drain of the NMOS N2 are coupled to a bit line bar BLB and a bit line BL, respectively.

In the cell schematic 610, the cell $S_{i,j}$ has external nodes ND1, ND2, ... and ND5 and internal nodes ND7, ND8 ... and ND10. The external nodes ND1, ND2, ND3, ND4 and ND5 are nodes at which terminals of the devices P1, P2, N1, N2, N3 and N4 are coupled to external lines such as VDD, VSS, WL, BL, and BLB. The external lines are coupled to, for example, other cells in the same row or same column. At the external node D1, the sources of the PMOSs P1 and P2 are coupled to the positive power supply VDD. The external node D1 is shared between the sources of the PMOSs P1 and P2 because the sources of the PMOSs P1 and P2 are shared in a cell layout 630 to be described with reference to FIG. 6B. At the external node D2, the grounds of the NMOSs N3 and N4 are coupled to the negative power supply VSS. Similar to the external node D1, the external node D2 is shared between the sources of the NMOSs N3 and N4. At the external node D3, the second source or drain of the NMOS N1 is coupled to the bit line bar BLB. At the external node D4, the gate of the NMOS N1 is coupled to the word line WL. At the external node D5, the second source or drain of the NMOS N2 is coupled to the bit line BL. At the external node ND4, the gate of the NMOS N2 is coupled to the word line WL. The internal nodes ND7, ND8 ... ND10 are terminals of the devices P1, P2, N1, N2, N3 and N4 that are only coupled to circuitry internal to the cell $C_{i,j}$ and not coupled to the external lines such as VDD, VSS, WL, BL, and BLB.

Figure 6B:
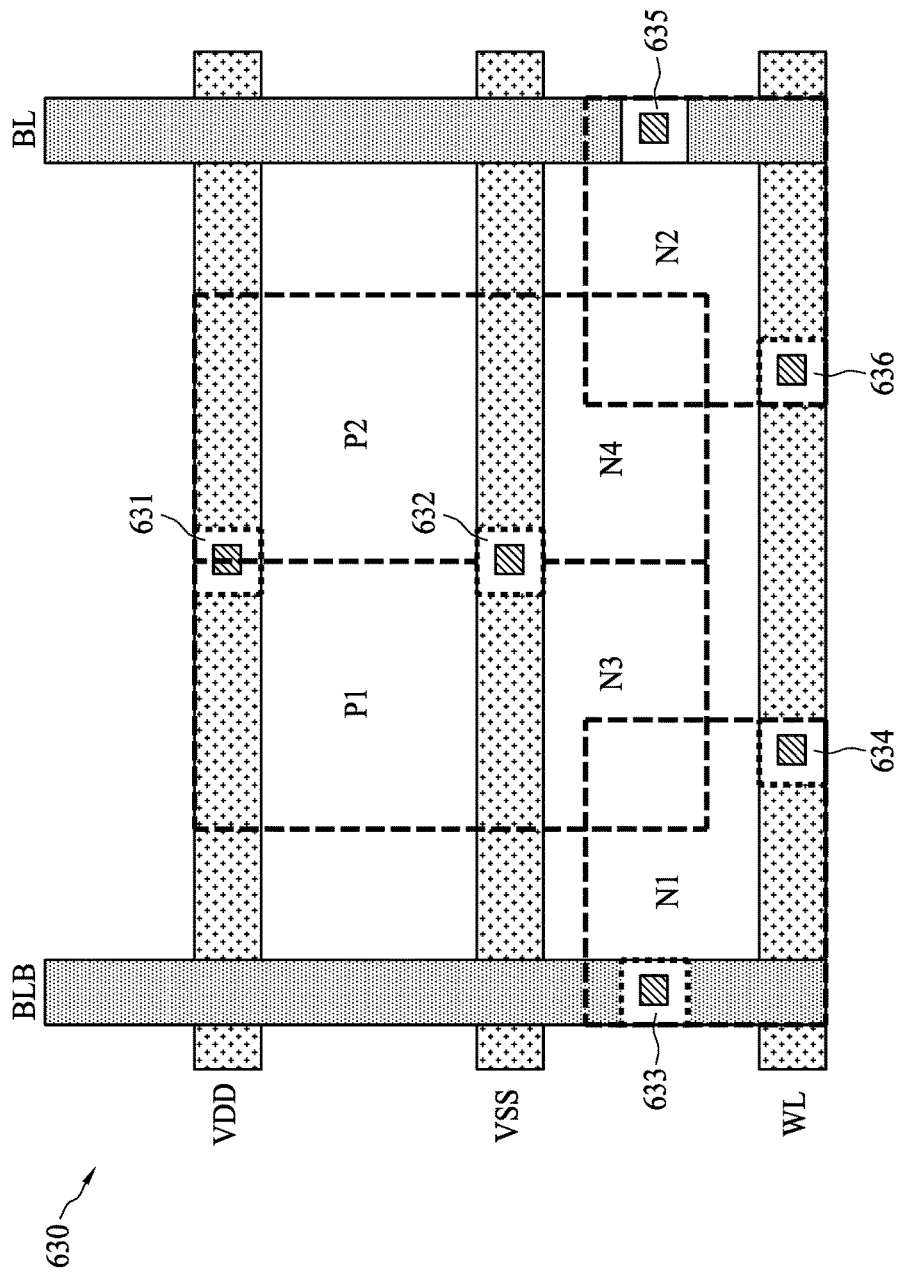
FIG. 6B is a diagram of a cell layout of any cell in the layouts of the corresponding first arrays in accordance with some embodiments.

FIG. 6B is a diagram of a cell layout 630 of any cell $S_{i,j}$ in the layouts 502, 504, 506 and 508 of the corresponding first arrays $A_1$, $A_2$, $A_3$ and $A_4$ in accordance with some embodiments. In the cell layout 630, horizontal lines VDD, VSS and WL and vertical lines BLB and BL correspond to the positive power supply VDD, the negative power supply VSS, the word line WL, the bit line bar BLB and the bit line BL in the cell schematic 610 in FIG. 6A, respectively. The device regions P1, P2, N1, N2, N3 and N4 correspond to the PMOSs P1 and P2, and NMOSs N1, N2, N3 and N4 in the cell schematic 610 in FIG. 6A, respectively. For simplicity, the layout of the devices and connections associated with the internal nodes of the cell $S_{i,j}$ are not shown in FIG. 6B. A contact 631 shared between the device regions P1 and P2 and overlapping with the horizontal line VDD results in the formation of the external node ND1 in FIG. 6A. A contact 632 shared between the device regions N3 and N4 and overlapping with the horizontal line VSS results in the formation of the external node ND2 in FIG. 6A. Contacts 633 and 634 on the device region N1 and overlapping with the vertical line BLB and the horizontal line WL, respectively, result in the formation of the external nodes ND3 and ND4 in FIG. 6A. Contacts 635 and 636 configured on the device region N2 and overlapping with the vertical line BL and the horizontal line WL, respectively, result in the formation of the external nodes ND5 and ND4 in FIG. 6A.

Figure 7:
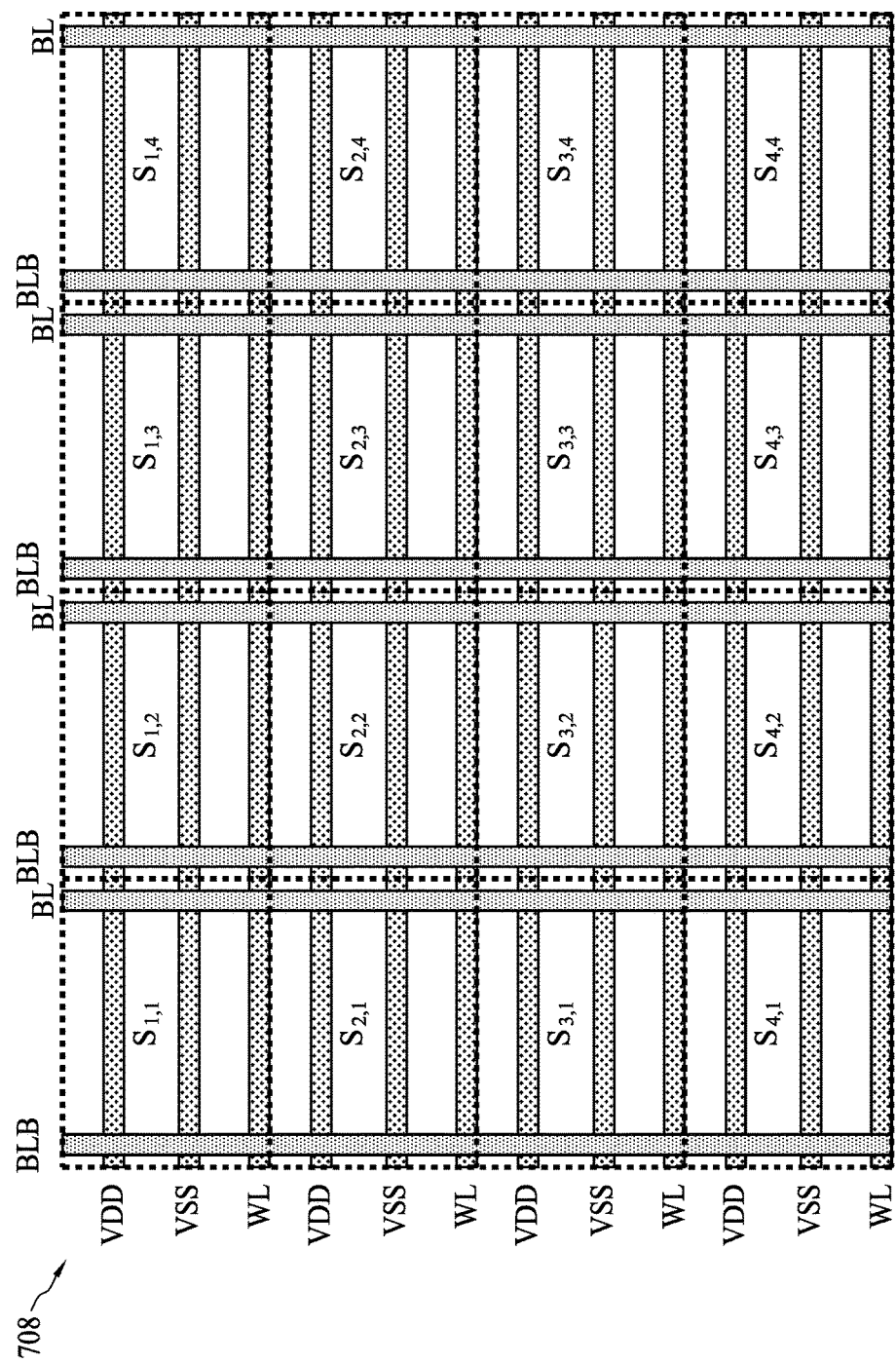
FIG. 7 is a schematic diagram of the layout of the first array in accordance with some embodiments.

FIG. 7 is a schematic diagram of the layout 708 of the first array $A_4$ in accordance with some embodiments. Compared to the layout 508 of the first array $A_4$ in FIG. 5, the external lines VDD, VSS, WL, BL and BLB of each cell $S_{1,1}$, $S_{1,2}$ ... or $S_{4,4}$ are shown. For simplicity, other elements and connections shown in FIG. 6B are omitted in FIG. 7. The layout 708 of the first array $A_4$ is used as an example to further illustrate the operation 202. The horizontal lines VDD, VSS and WL of the cells in a row such as the row containing the cells $S_{1,1}$, $S_{1,2}$ ... and $S_{1,4}$ are correspondingly connected to each other, and the vertical lines BLB and BL of the cells in a column such as the column containing the cells $S_{1,1}$, $S_{2,1}$ ... and $S_{4,1}$ are correspondingly connected to each other. The first plurality of circuit paths in the operations 202 include the horizontal lines VDD, VSS, WL running along the horizontal side length n of the first array $A_4$, and the vertical lines BLB and BL running along the vertical side length m of the first array $A_4$. Each of the plurality of cells $S_{1,1}$, $S_{1,2}$ . . . and $S_{4,4}$ is configured with a first node such as the external node ND1, ND2, ND3, ND4 or ND5 (shown in FIG. 6A) that is coupled to a respective one of the first circuit paths such as the line VDD, VSS, BLB, WL, BL or WL.

In FIG. 7, although each of the cells $S_{1,1}$, $S_{1,2}$ . . . and $S_{4,4}$ of the first array $A_4$ has the same layout, parasitic elements associated with the corresponding external nodes ND1, ND2, . . . and ND5 (shown in FIG. 6A) of the cells $S_{1,1}$, $S_{1,2}$ . . . and $S_{4,4}$ at different positions of the layout 708 can have different characteristics. For example, each of the cell $S_{2,2}$, $S_{2,3}$, $S_{3,2}$ or $S_{3,3}$ at a center position of the layout 708, the cell $S_{1,2}$, $S_{1,3}$, $S_{4,2}$, or $S_{4,3}$ at a horizontal border position of the layout 708, the cells $S_{2,1}$, $S_{3,1}$, $S_{2,4}$ or $S_{3,4}$ at a vertical border position of the layout 708, and the cell $S_{1,1}$, $S_{1,4}$, $S_{4,1}$ or $S_{4,4}$ at a corner position of the layout 708 have differently arranged neighboring cells. Therefore, coupling capacitance associated with the corresponding external nodes ND1), ND2, . . . and ND5 of each of the cell (e.g. $S_{2,2}$) at the center position of the layout 708, the cell (e.g. $S_{1,2}$) at the horizontal border position of the layout 708, the cell (e.g. $S_{2,1}$) at the vertical border position of the layout 708 and the cell (e.g. $S_{1,1}$) at a corner position of the layout 708 are different. As shown in FIG. 5, the cells at the center positions, horizontal border positions, vertical border positions and corner positions are filled with different patterns, respectively. In some approaches, because of the difference in the characteristics of the parasitic elements associated with the corresponding external nodes of the cells at the different positions, the cell models for the cells at the different positions are calibrated with different characteristics.

In some embodiments, in order to obtain a representative characteristic associated with the corresponding external nodes ND1, ND2 . . . or ND5 of all of the cells at the different positions, the plurality of first circuit paths are correspondingly combined according to respective connections to cells in the plurality of cells. For example, horizontal lines VDD each of which is connected to external nodes ND1 of a row of cells in the plurality of cells are combined, and horizontal lines VSS each of which is connected to external nodes ND2 of a row of cells in the plurality of cells are combined. In FIG. 7, the horizontal lines VDD, VSS or WL of all of the rows are named the same, and the vertical lines BL or BLB of all of the columns are named the same. Effectively, the horizontal lines VDD, VSS or WL of all of the rows are parallel connected, and the vertical lines BL or BLB of all of the columns are parallel connected.

In operation 204, the first representative characteristic associated with the plurality of first circuit paths is extracted. Because the plurality of first circuit paths are correspondingly combined, the extracted characteristic associated with the combined external lines VDD), VSS, WL, BL or BLB is a total characteristic of the combined external lines VDD, VSS WL, BL or BLB. For example, the extracted coupling capacitance between the combined horizontal lines WL and the combined vertical lines BL is a total coupling capacitance between the parallel connected horizontal lines WL and the parallel connected combined vertical lines BL. The first representative characteristic is then obtained by averaging the extracted total characteristic with respect to the number of cells of the first array. For example, in the case of the first array $A_4$, the extracted total characteristic is averaged by 16.

The method of extracting a total characteristic of a correspondingly combined plurality of first circuit paths and averaging the total characteristic by the number of cells to obtain a representative characteristic is exemplary. Other methods such as collecting characteristics of the plurality of first circuit paths and averaging the summed total characteristics by the number of cells are within the contemplated scope of the present disclosure.

Figure 8:
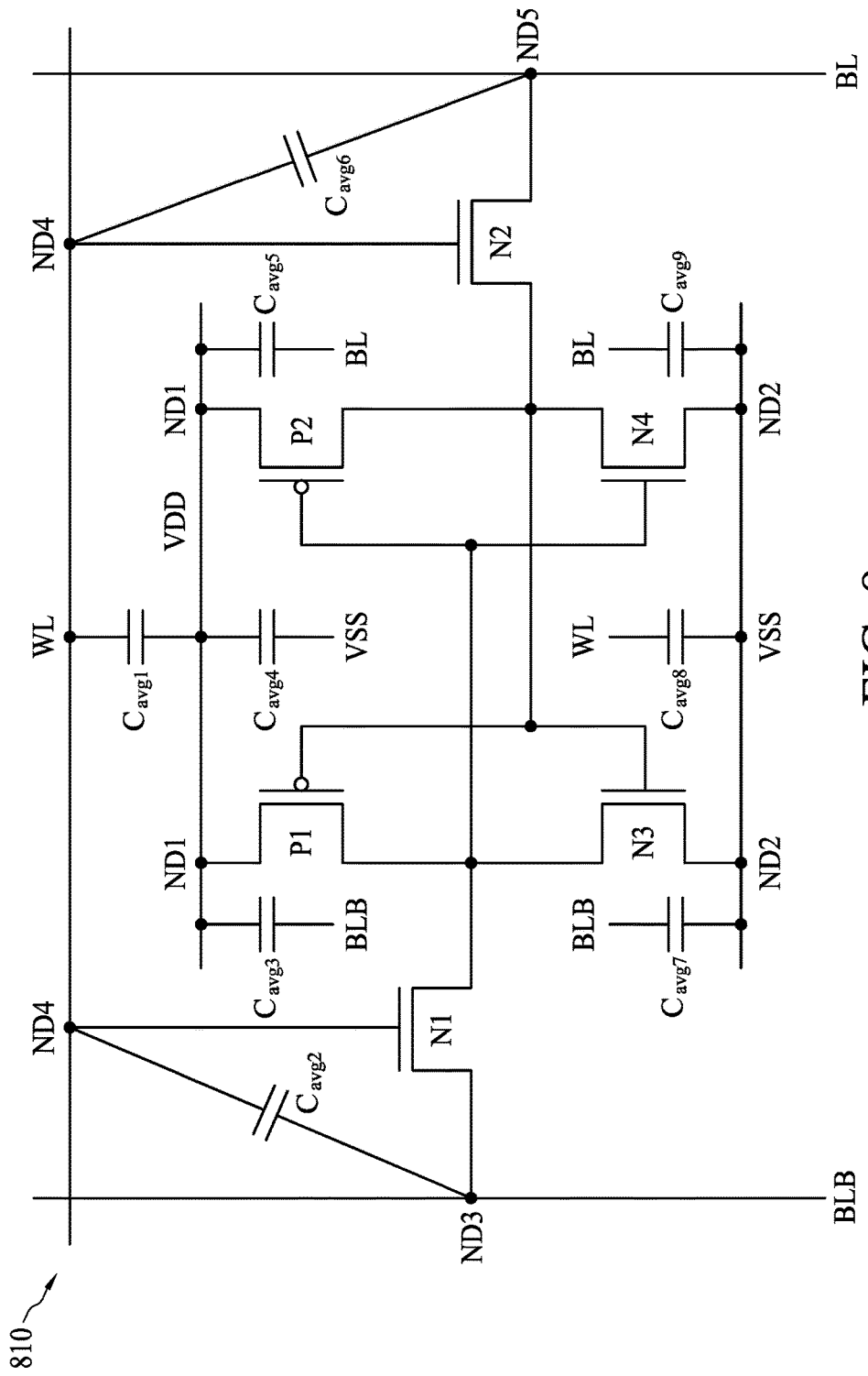
FIG. 8 is a diagram of a cell schematic of any cell in the first array that is annotated with exemplary representative characteristics associated with external nodes in accordance with some embodiments.

FIG. 8 is a diagram of a cell schematic 810 of any cell $S_{1,1}$, $S_{1,2}$ . . . or $S_{4,4}$ in the first array $A_4$ that is annotated with exemplary representative characteristics associated with the external nodes ND1, ND2 . . . and ND5 in accordance with some embodiments. The extracted representative characteristics include average coupling capacitance $C_{avg1}$, $C_{avg2}$ . . . and $C_{avg9}$. The average coupling capacitance $C_{avg1}$ exists between the word line WL and the positive power supply VDD and is associated with the external nodes ND1 and ND4. The average coupling capacitance $C_{avg2}$ exists between the word line WL and the bit line bar BLB and is associated with the external nodes ND3 and ND4. The average coupling capacitance $C_{avg3}$ exists between the positive power supply VDD and the bit line bar BLB and is associated with the external nodes ND1 and ND3. The average coupling capacitance $C_{avg4}$ exists between the positive power supply VDD and the negative supply line VSS and is associated with the external nodes ND1 and ND2. The average coupling capacitance $C_{avg5}$ exists between the positive power supply VDD and the bit line BL and is associated with the external nodes ND1 and ND5. The average coupling capacitance $C_{avg6}$ exists between the word line WL and the bit line BL and is associated with the external nodes ND5 and ND4. The average coupling capacitance $C_{avg7}$ exists between the negative power supply VSS and the bit line bar BLB and is associated with the external nodes ND2 and ND3. The average coupling capacitance $C_{avg8}$ exists between the negative power supply VSS and the word line WL and is associated with the external nodes ND2 and ND4. The average coupling capacitance $C_{avg9}$ exists between the negative power supply VSS and the bit line BL and is associated with the external nodes ND2 and ND5. Some other coupling capacitance, such as coupling capacitance between the external lines VDD, VSS, WL, BL and BLB and the ground is omitted for simplicity.

In operation 206, a, universal cell model applied to each cell in a second array is generated based on a base cell model comprising parameters independent of positions in the second array, and the first representative characteristic. In some embodiments, the second array has the same array size configuration as the first array. Based on the cell schematic 810 in FIG. 8, the universal cell model includes parameters of a base cell model which models behaviors common to all of the cells $S_{1,1}$, $S_{1,2}$ . . . $S_{4,4}$ in the layout 508 of the first array $A_4$ in FIG. 5, and parameters obtained based on the representative characteristics such as the average coupling capacitance $C_{avg1}$, $C_{avg2}$ . . . and $C_{avg9}$. In some embodiments, the base cell model is a 6T MOS model, and the parameters of the base cell model include AC and DC model parameters of the MOS transistor models. Because the average coupling capacitance $C_{avg1}$, $C_{avg2}$ . . . and $C_{avg9}$ are obtained from the cells $S_{1,1}$, $S_{1,2}$ . . . and $S_{4,4}$ in all of the positions of the first array, the average coupling capacitance $C_{avg1}$, $C_{avg2}$ . . . and $C_{avg9}$ will be different if the numbers of cells in the center positions, in the horizontal border positions and/or in the vertical border positions are different. Therefore, in FIG. 5, the average coupling capacitance $C_{avg1}$, $C_{avg2}$ . . . and $C_{avg9}$ of the cells $S_{1,1}$, $S_{1,2}$ . . . and $S_{2,2}$ in the layout 502, the cells $S_{1,1}$, $S_{1,2}$ . . . and $S_{2,4}$ in the layout 504, the cells $S_{1,1}$, $S_{1,2}$ . . . and $S_{4,2}$ in the layout 506 and the $S_{1,1}$, $S_{1,2}$ . . . and $S_{4,4}$ in the layout 508 are different. In other words, the average coupling capacitance $C_{avg1}$, $C_{avg2}$ . . . and $C_{avg9}$ are dependent on the array size configuration of the first array $A_1$, $A_2$, . . . or $A_4$.

Figure 9:
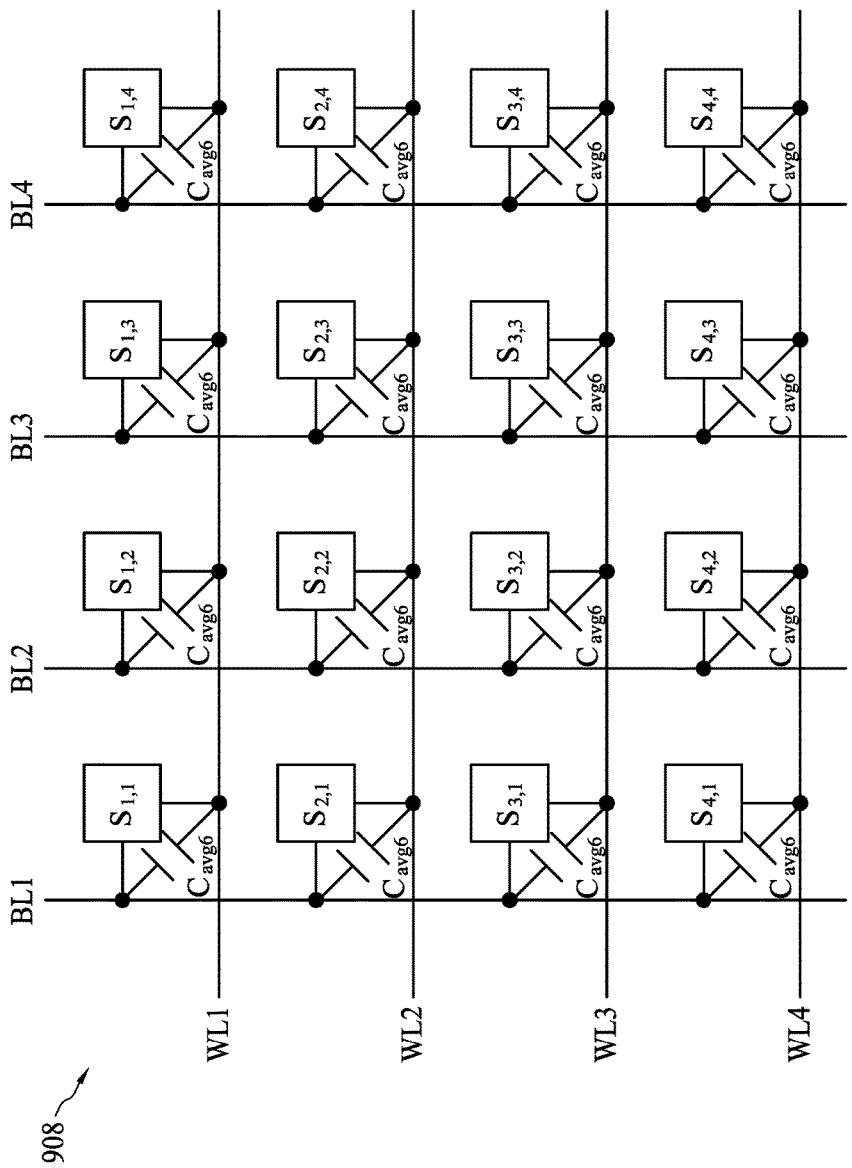
FIG. 9 is a diagram of an array schematic of the first array that employs the universal cell model in accordance with some embodiments.

FIG. 9 is a diagram of an array schematic 908 of the first array $A_4$ that employs the universal cell model in accordance with some embodiments. The array schematic 908 represents a simplified physical netlist of the first array $A_4$ to be provided to a circuit simulator 1308 to be described with reference to FIG. 13. Each cell $S_{1,1}$, $S_{1,2}$ . . . or $S_{4,4}$ is coupled to a respective word line WL1, WL2 . . . or WL4 and a respective bit line BL1, BL2, . . . or BL4. By adopting the universal cell model, each of the cells $S_1$, $S_{1,2}$ . . . and $S_{4,4}$ has, for example, the same average coupling capacitance $C_{avg6}$ between the external nodes ND5 and ND4 (labeled in FIG. 8). Therefore, during the circuit simulation, the cell models for each of the cells $S_{1,1}$, $S_{1,2}$ . . . and $S_{4,4}$ are considered identical.

Figure 10:
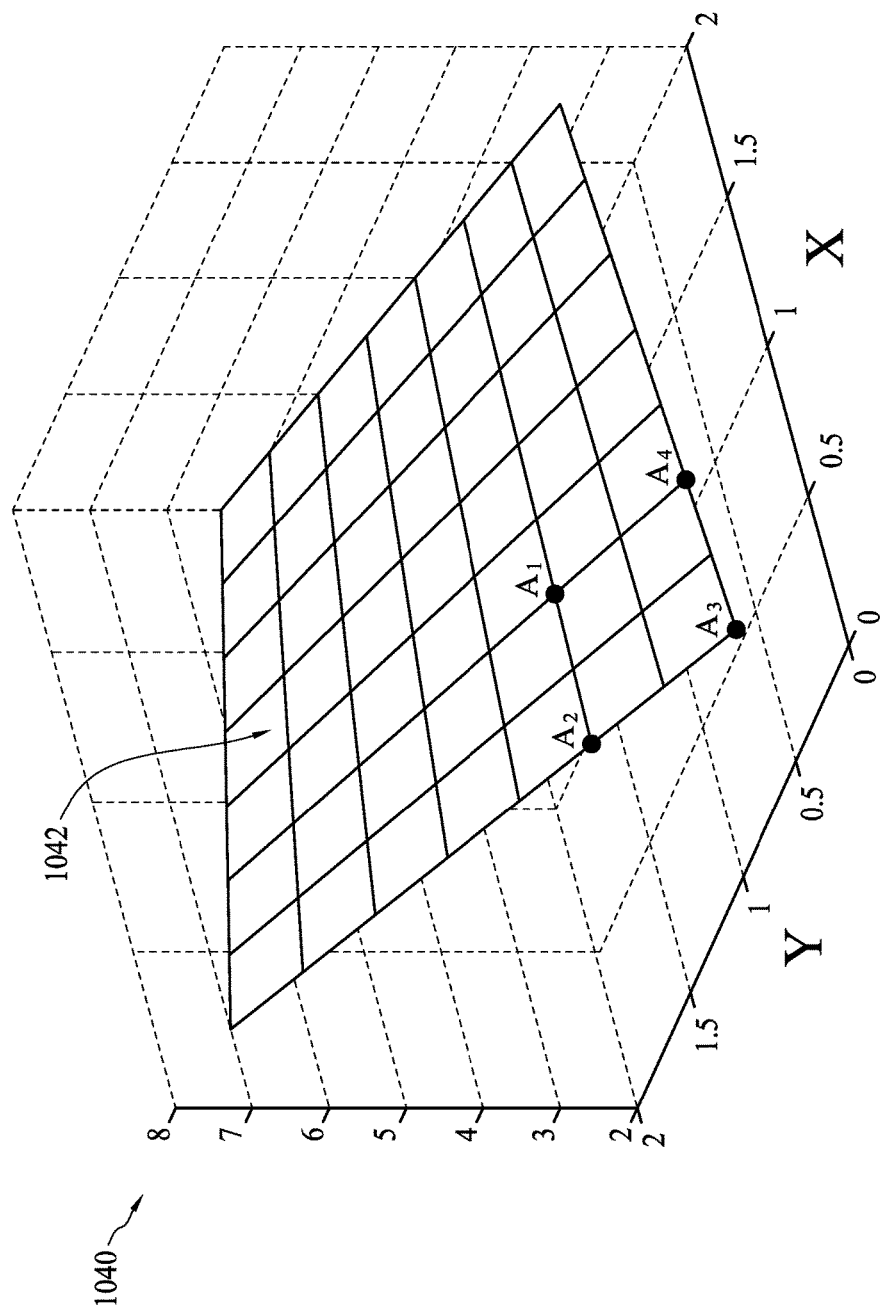
FIG. 10 is a plot of an exemplary scaling trend of representative characteristics of the different first arrays with respect to variables X and Y in accordance with some embodiments.

In other embodiments, in the operation 206, the second array has a different array size configuration from the first array. To obtain the representative characteristics (e.g. $C_{avg1}$, $C_{avg2}$ . . . and $C_{avg9}$) of the second array having the different array size configuration from the first array, a principle component extraction (PCE) method is adopted. By using the PCE method, the representative characteristics (e.g. $C_{avg6}$) of the different first arrays $A_1$, $A_2$, $A_3$ and $A_4$ are represented in terms of variables that present variance among the representative characteristics $C_{avg6}$ of the different first arrays $A_1$, $A_2$, $A_3$ and $A_4$ more than other variables. The variables that more obviously present the variance are the principle components. For example, as described with reference to FIG. 8, the representative characteristic $C_{avg6}$ is dependent on the array size configurations of the different first arrays $A_1$, $A_2$, $A_3$ and $A_4$. Therefore, the variables chosen can be in terms of the array size configuration of an array. Then, a trend of how the representative characteristics $C_{avg6}$ of the different first arrays $A_1$, $A_2$, $A_3$ and $A_4$ are varying with variables is extracted. FIG. 10 is a plot 1040 of an exemplary scaling trend of the representative characteristics $C_{avg6}$ of the different first arrays $A_1$, $A_2$, $A_3$ and $A_4$ with respect to variables X and Y in accordance with some embodiments. The variables X and Y are in terms of an array size configuration of an array. Based on the points $A_1$, $A_2$, $A_3$ and $A_4$ for the corresponding first arrays $A_1$, $A_2$, $A_3$ and $A_4$ in the plot, a plane 1042 is constructed. The plane 1042 is the extracted scaling trend of the representative characteristics $C_{avg6}$ with respect to the variables X and Y.

As described with reference to FIG. 3, the operation 206 includes the operations 308, 310 and 312. In operation 308, a coefficient matrix to be multiplied to a variable vector filled using the array size configuration of the first array to approximate the first representative characteristic is obtained. In some embodiments, the representative characteristics $C_{avg1}$, $C_{avg2}$ . . . and $C_{avgi}$ are approximated by equation (1):

$$D \cdot u = C_{ap} \sim C_{avg} \quad (1)$$

$$D = \begin{bmatrix} r_1 & w_1 & l_1 & p_1 \\ r_2 & w_2 & l_2 & p_2 \\ \vdots & \vdots & \vdots & \vdots \\ r_i & w_i & l_i & p_i \end{bmatrix}$$

$$u = \begin{bmatrix} 1 \\ X \\ Y \\ XY \end{bmatrix}$$

$$C_{ap} = \begin{bmatrix} C_{ap1} \\ C_{ap2} \\ \vdots \\ C_{api} \end{bmatrix}$$

$$C_{avg} = \begin{bmatrix} C_{avg1} \\ C_{avg2} \\ \vdots \\ C_{avgi} \end{bmatrix}$$

where D is the coefficient matrix, u is the variable vector, $C_{ap}$ is a vector of approximated representative characteristics, $C_{avg}$ is a vector of representative characteristics, and i is a number of representative characteristics and is equal to 9 in the example in FIG. 8. Referring to FIG. 5, the constant term "1" in the variable vector u is for a component in the representative characteristic (e.g. $C_{avg6}$) that does not change with the array size configuration of the first array. That is, the constant term reflects the portion of the cells at the center positions in the composition of the first array. A variable X is based on the vertical side length m, and a variable Y is based on the horizontal side length n. In some embodiments, because there are two vertical borders per array, X is equal to sum of two vertical side lengths normalized by an area of the first array. Therefore, $$X = \frac{2m}{mn} = \frac{2}{n}.$$

Similarly, Y is equal to sum of two horizontal side lengths normalized by the area of the first array. Therefore, $$Y = \frac{2m}{mn} = \frac{2}{m}.$$

The variable X reflects the portion of the cells at the vertical border positions in the composition of the first array. The variable Y reflects the portion of the cells at the horizontal border positions in the composition of the first array. Further, by having a variable XY, the portion of the cells at the corner positions in the compositions of the first array is reflected. The coefficient matrix D and the variable vector u together describe the scaling trend of the vector of the representative characteristics. Although the scaling trend in FIG. 10 is shown as a plane 1042, by including the variable XY in the variable vector u, the scaling trend becomes non-linear.

In the operation 308, for each of the first arrays $A_1$, $A_2$, $A_3$ and $A_4$, the variable vector u and the vector of the representative characteristics $C_{avg}$ are known and a numerical process is performed to find the corresponding coefficient matrix D. Referring to FIG. 5, for each of the first arrays $A_1$, $A_2$, $A_3$ and $A_4$, the variable vector u can be obtained based on the respective side lengths m and n. Also, for each of the first arrays $A_1$, $A_2$, $A_3$ and $A_4$, the vector of the representative characteristics $C_{avg}$ has been obtained from the operations 202 and 204 described with references to FIGS. 2, and 5 to 8. In some embodiments, the numerical process finds an optimized coefficient matrix D that results in the least total error between the vectors of approximated representative characteristics $C_{ap}$ of all of the arrays $A_1$, $A_2$, $A_3$ and $A_4$ and the vectors of representative characteristics $C_{avg}$ of all of the arrays $A_1$, $A_2$, $A_3$ and $A_4$.

Figure 11:
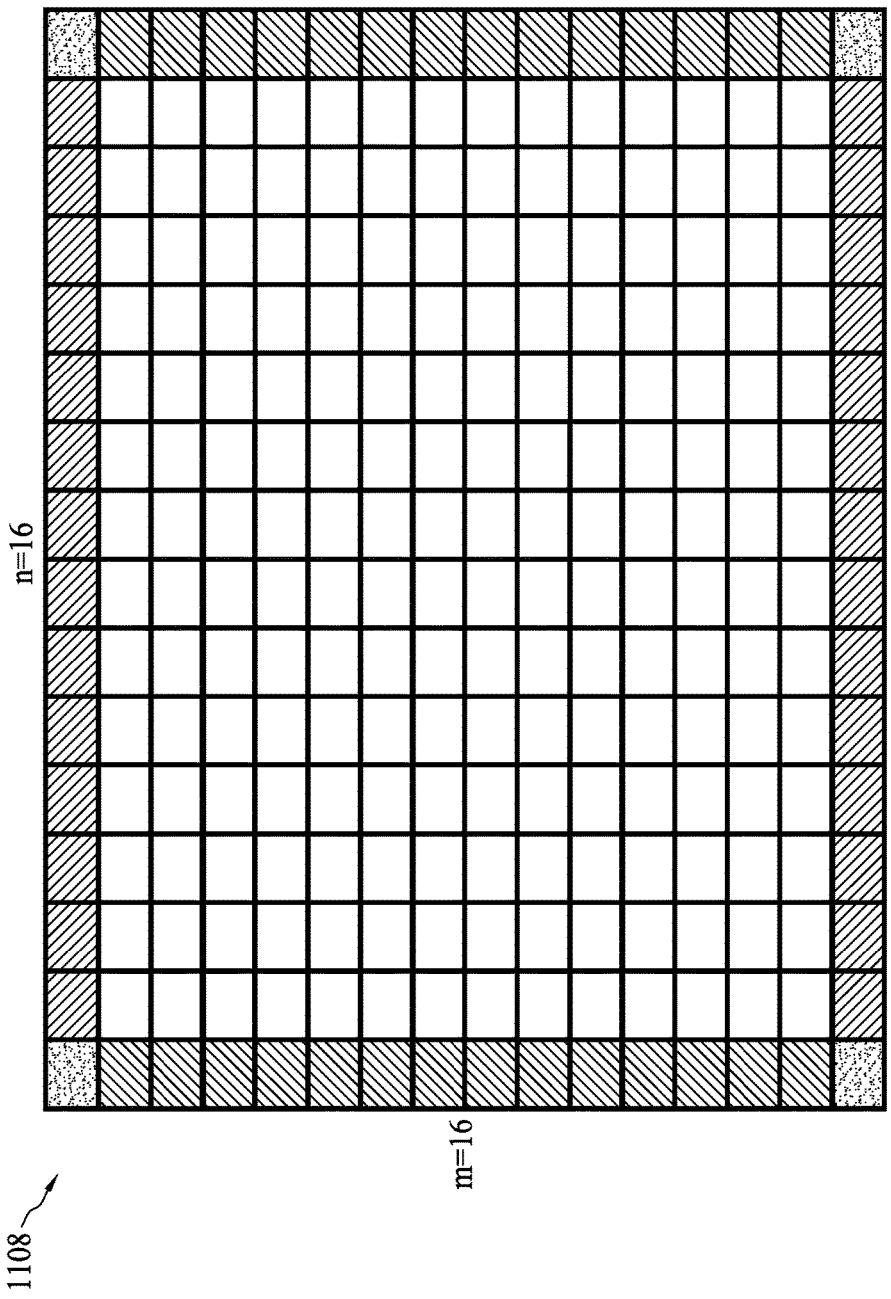
FIG. 11 is a schematic diagram of a layout of a second array in accordance with some embodiments.

In operation 310, a second approximated representative characteristic of the second array is obtained using the coefficient matrix and the variable vector filled using the array size configuration of the second array. FIG. 11 is a schematic diagram of a layout 1108 of the second array in accordance with some embodiments. As an example, the second array has an array size configuration m=16 and n=16. A vector of approximated representative characteristics $C_{ap}$ of the second array is extrapolated by substituting the array size configuration m=16 and n=16 of the second array into the variable vector u, and evaluating equation (1) using the coefficient matrix D) found in the operation 308 and the substituted variable vector u. Similarly, if the second array has an array size configuration that is smaller than that of the first arrays, a vector of approximated representative characteristics $C_{ap}$ of the second array can be interpolated.

Therefore, representative characteristics of an array of arbitrary array size configurations can be obtained without going through full parasitic extraction.

In operation 312, the second approximated representative characteristic is applied to the base cell model to generate the universal cell model. Referring to FIG. 8, the approximated representative characteristics $C_{ap1}$, $C_{ap2}$ ... and $C_{ap9}$ of the vector $C_{ap}$ of the second array is applied to the base cell model described with reference to FIG. 8. The average coupling capacitance $C_{avg1}$, $C_{avg2}$ ... and $C_{avg9}$ coupled between the corresponding two of the external lines VDD, VSS, WL, BL and BLB are substituted by the approximated representative characteristics $C_{ap1}$, $C_{ap2}$ ... and $C_{ap9}$ of the vector $C_{ap}$ of the second array to generate the universal cell model.

In the embodiments described with reference to the operation 308, for 2D arrays, the variables X and Y are equal to the sum of the two vertical side lengths normalized with respect to the area, and the sum of the two horizontal side lengths normalized with respect to the area, respectively. Other embodiments, such as those for 3D arrays, variables X, Y and Z can be equal to the sum of the areas of the top and bottom arrays normalized with respect to the volume, the sum of the areas of the front and back arrays normalized with respect to the volume, and the sum of the areas of the left and right arrays normalized with respect to the volume, respectively.

Figure 12:
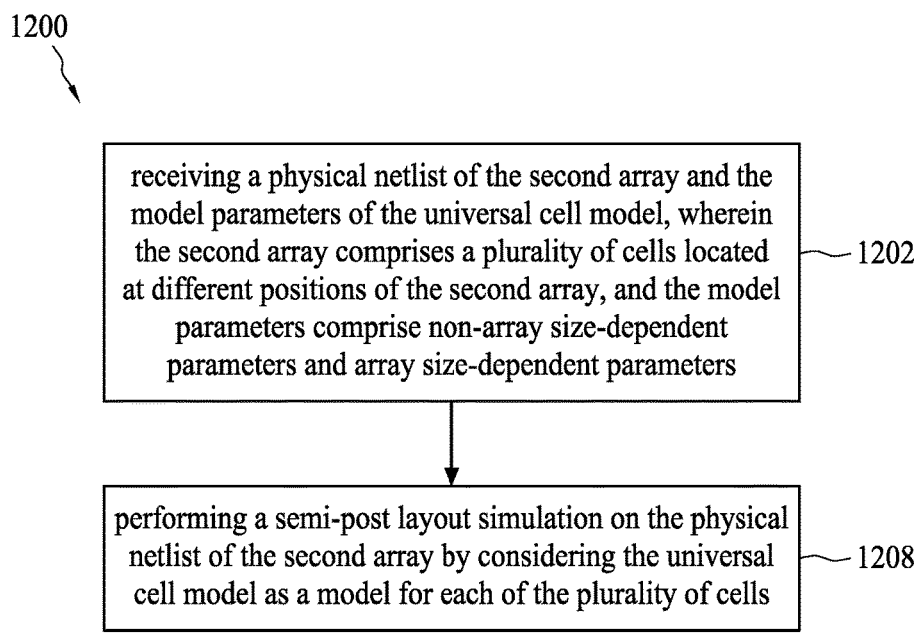
FIG. 12 is a flow diagram of a method for performing a semi-post layout simulation on the second array using the universal cell model in accordance with some embodiments.

FIG. 12 is a flow diagram of a method 1200 for performing a semi-post layout simulation on the second array using the universal cell model in accordance with some embodiments. In operation 1202, a physical netlist of the second array and the model parameters of the universal cell model are received, wherein the second array comprises a plurality of cells located at different positions of the second array, and the model parameters comprise non-array size-dependent parameters and array-size-dependent parameters. In operation 1208, a semi-post layout simulation is performed on the physical netlist of the second array by considering the universal cell model as a model for each of the plurality of cells.

Figure 13:
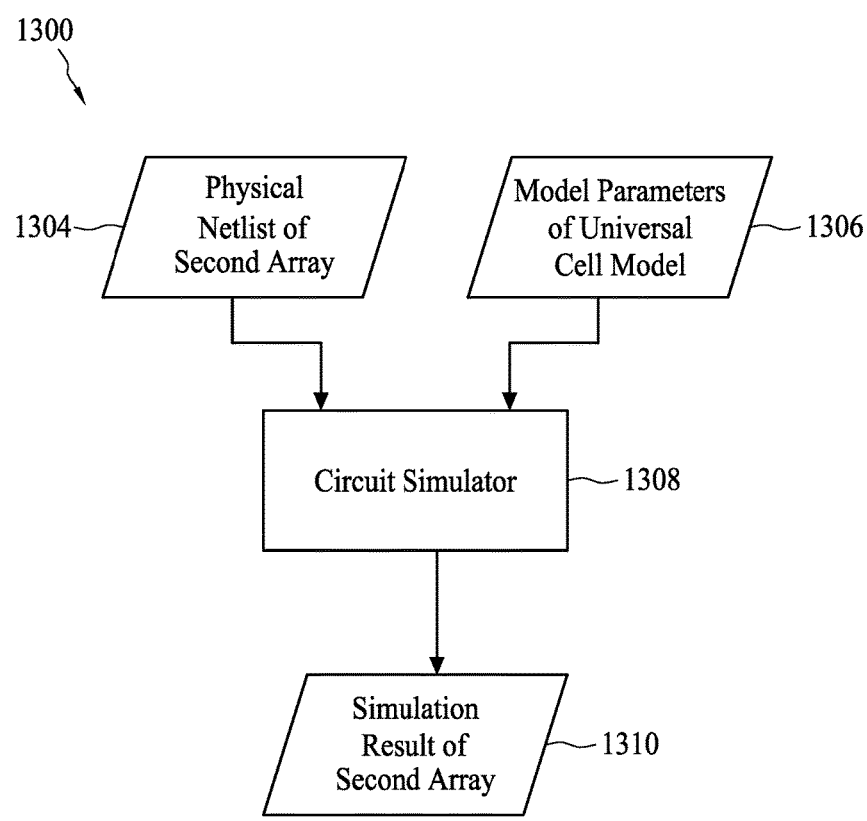
FIG. 13 is a functional block diagram of a software system for performing a semi-post layout simulation on the second array using the universal cell model in accordance with some embodiments.

FIG. 13 is a, functional block diagram of a software system 1300 for performing a semi-post layout simulation on the second array using the universal cell model in accordance with some embodiments. The software system 1300 comprises a circuit simulator 1308. The circuit simulator 1308 is configured to receive a physical netlist of the second array and the model parameters of the universal cell model. The second array comprises a plurality of cells located at different positions of the second array. The model parameters comprise non-array size-dependent parameters and array-size dependent parameters. The circuit simulator 1308 is further configured to perform a semi-post layout simulation on the physical netlist of the second array by considering the universal cell model as a model for each of the plurality of cells.

In the following, further details with respect to the operations in FIG. 12 are provided. These further details are also applicable to data or modules described with reference to FIG. 13.

In operation 1202, a physical netlist of the second array and the model parameters of the universal cell model are received. The physical netlist can be represented in the form of a cell schematic. In FIG. 9, the cell schematic 908 is a physical netlist of the second array with m=4 and n=4. The physical netlist of the second array with m=16 and n=16 (as shown by the layout 1108 in FIG. 11) has 16 similar blocks of the cell schematic 908. In the following, the second array with m==4 and n=4 is used as an example. The second array comprises the plurality of cells $S_{1,1}$, $S_{1,2}$ ... and $S_{4,4}$ located at different positions of the second array. In FIG. 8, the universal cell model obtained in the operation 206 for the second array comprises parameters of the base cell model, and parameters based on the representative characteristics $C_{avg1}$, $C_{avg2}$ ... and $C_{avg9}$ associated with the corresponding external nodes ND1, ND2, ... and ND5 of the cell. The parameters of the base cell model do not dependent on the array size configuration m and n of the second array and are therefore non-array size-dependent. The parameters based on the representative characteristics $C_{avg1}$, $C_{avg2}$ ... and $C_{avg9}$ are dependent on the side lengths m and n of the second array and are therefore array-size-dependent.

In operation 1208, a semi-post layout simulation on the physical netlist of the second array is performed by considering the universal cell model as a model for each of the plurality of cells. Referring to FIG. 9, when performing the semi-post layout simulation on the cell schematic 908 of the second array, the universal cell model for the cell schematic 810 in FIG. 8 is applied to each of the cells $S_{1,1}$, $S_{1,2}$ ... and $S_{4,4}$ in the second array.

Compared to the post layout simulation that employs different models for cells at different positions of the array or flattens the netlist of the array, the semi-post layout simulation is much faster. Further, the semi-post layout simulation is more accurate than the pre-layout simulation, and is more reliable than an empirically-based critical path simulation.

Figure 14:
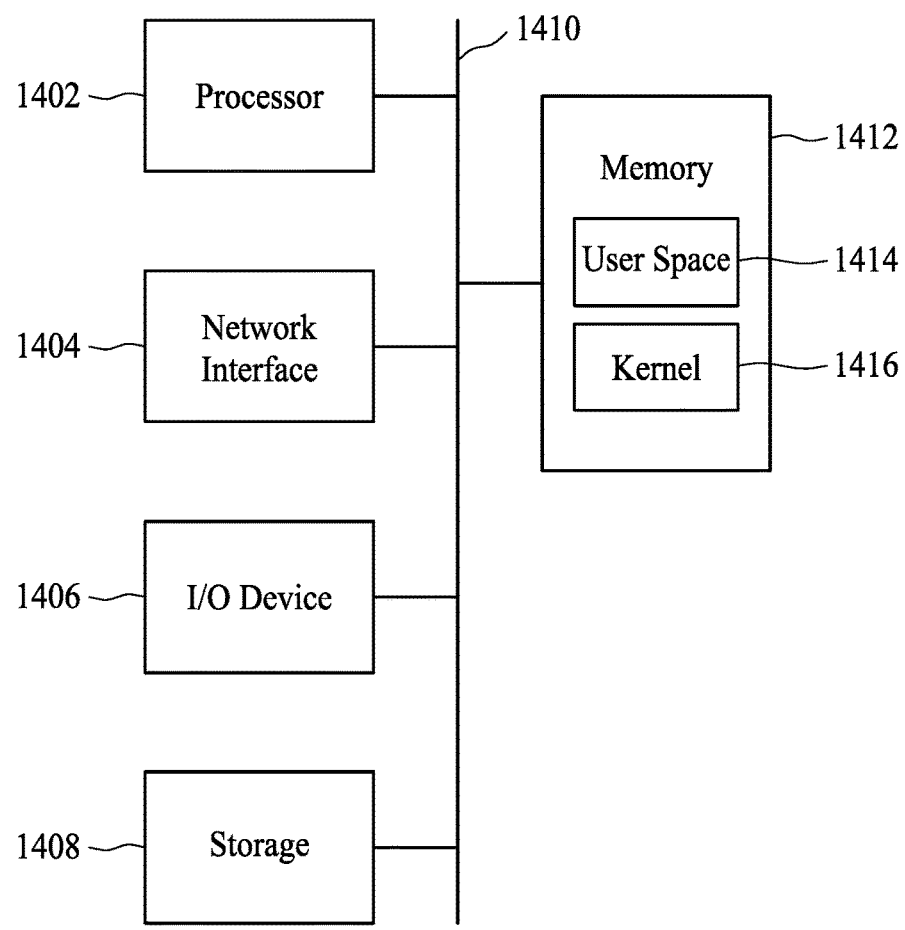
FIG. 14 is a block diagram of a hardware system for implementing the method and software system embodiments described with references to FIGS. 2 to 13 in accordance with some embodiments.

FIG. 14 is a block diagram of a hardware system 1400 for implementing the method and software system embodiments described with references to FIGS. 2 to 13 in accordance with some embodiments. The system 1400 includes at least one processor 1402, a network interface 1404, an input and output (I/O) device 1406, a storage 1408, a memory 1412, and a bus 1410. The bus 1410 couples the network interface 1404, the I/O device 1406, the storage 1408 and the memory 1412 to the processor 1402.

In some embodiments, the memory 1412 comprises a random access memory (RAM) and/or other volatile storage device and/or read only memory (ROM) and/or other non-volatile storage device. The memory 1412 includes a kernel 1416 and user space 1414, configured to store program instructions to be executed by the processor 1402 and data accessed by the program instructions.

In some embodiments, the network interface 1404 is configured to access program instructions and data accessed by the program instructions stored remotely through a network. The I/O device 1406 includes an input device and an output device configured for enabling user interaction with the system 1400. The input device comprises, for example, a keyboard, a mouse, etc. The output device comprises, for example, a display, a printer, etc. The storage device 1408 is configured for storing program instructions and data accessed by the program instructions. The storage device 1408 comprises, for example, a magnetic disk and an optical disk.

In some embodiments, when executing the program instructions, the processor 1402 is configured to perform the method described with reference to FIGS. 2, 3, 5 to 11 and 12, or as the software system described with reference to FIGS. 4, 5 to 11 and 13.

In some embodiments, the program instructions are stored in a non-transitory computer readable recording medium such as one or more optical disks, hard disks and non-volatile memory devices. In some embodiments, a file containing the model parameters of the universal cell model described with references to FIGS. 8 and 9 is stored in a non-transitory computer-readable storage medium.

Some embodiments have one or a combination of the following features and/or advantages. In some embodiments, for each of at least a first array, a first representative characteristic associated with a correspondingly combined plurality of first circuit paths running across at least one side length in an array size configuration of a first array is extracted. For a second array having the same array size configuration as the first array, a universal cell model applied to each cell in the second array is generated using a base cell model including parameters independent of positions in the second array, and the first representative characteristic. For a second array having an array size configuration different from that of the first array, a principle component extraction method, and inter or extrapolation are performed to obtain a second representative characteristic of the second array. For the PCE method, a coefficient matrix of an approximation equation is extracted from the first representative characteristic in terms of a variable vector filled using the array size configuration of the first array, and for the inter or extrapolation, the second representative characteristic is interpolated or extrapolated by evaluating the approximation equation with variable vector filled using the array size configuration of the second array. A universal cell model applied to each cell in the second array is generated using the base cell model and the second representative characteristic. Therefore, representative characteristics of an array of arbitrary array size configuration can be obtained without going through full parasitic extraction. Further, during a semi-post layout simulation, the universal cell model is applied to each cell of the second array. Hence, compared to the post layout simulation that applies different models to cells at different positions of the array, or flattens the netlist of the array, the simulation time for the semi-post layout simulation is much shorter. Further, the semi-post layout simulation is more accurate than the pre-layout simulation, and is more reliable than an empirically-based critical path simulation.

In some embodiments, in a method performed by at least one processor, for each array of at least a first array, a layout of the first array which comprises a plurality of cells, and a plurality of first circuit paths running across at least one side length in a first array size configuration of the first array is received by the at least one processor. Each of the plurality of cells is configured with a first node that is coupled to a respective one of the plurality of first circuit paths. A first representative characteristic associated with the plurality of first circuit paths is extracted by the at least one processor. A universal cell model applied to each cell in a, second array is generated by the at least one processor based on a base cell model comprising parameters independent of positions in the second array, and the first representative characteristic. The second array having a second array size configuration the same as or different from the first array size configuration.

In some embodiments, a system comprises at least one processor, configured to execute program instructions which configure the at least one processor as an extraction module and a universal cell model-generating module, and at least one memory configured to store the program instructions. The extraction module is configured to receive, for each array of at least a first array, a layout of the first array which comprises a plurality of cells, and a plurality of first circuit paths running across at least one side length in a first array size configuration of the first array. Each of the plurality of cells is configured with a first node that is coupled to a respective one of the plurality of first circuit paths. The extraction module is further configured to extract a first representative characteristic associated with the plurality of first circuit paths. The universal cell model-generating module is configured to generate a, universal cell model applied to each cell in a second array based on a base cell model comprising parameters independent of positions in the second array, and the first representative characteristic. The second array has a second array size configuration the same as or different from the first array size configuration.

In some embodiments, a non-transitory computer-readable storage medium storing a file that comprises model parameters of a universal cell model for performing a simulation on a physical netlist of an array. The model parameters of the universal cell model comprise non-array size-dependent parameters and array size-dependent parameters. The non-array size-dependent parameters are independent of an array size configuration of the array. The array size-dependent parameters are dependent of the array size configuration and are independent of a position of a cell to which the universal cell model is applied.

In some embodiments, in a method performed by at least one processor, a physical netlist of a first array and model parameters of a universal cell model is received by the at least one processor. The first array comprises a plurality of cells located at different positions of the first array. The model parameters of the universal cell model comprise non-array size-dependent parameters that are independent of an array size configuration of the array and array size-dependent parameters that are dependent of the array size configuration and are independent of a position of a cell to which the universal cell model is applied. Simulation is performed by the at least one processor on the physical netlist of the first array by considering the universal cell model as a model for each of the plurality of cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, performed by at least one processor, for designing and implementing an integrated circuit, the method comprising:
   receiving, by the at least one processor, for each of at least a first array, a layout of the first array which comprises a plurality of cells, and a plurality of first circuit paths running across at least one side length in a first array size configuration of the first array,
      each of the plurality of cells being configured with a first node that is coupled to a respective one of the plurality of first circuit paths;
   extracting, by the at least one processor, a first representative characteristic associated with the plurality of first circuit paths;
   generating, by the at least one processor, a universal cell model applied to each cell in a second array based on a base cell model comprising parameters independent of positions in the second array, and the first representative characteristic,
   the second array having a second array size configuration the same as or different from the first array size configuration; and
   effecting a physical implementation of an integrated circuit based on the universal cell model.

2. The method of claim 1, wherein the plurality of first circuit paths are correspondingly combined according to respective connections to cells in the plurality of cells, and the first representative characteristic is a characteristic of the correspondingly combined plurality of first circuit paths averaged by a number of the plurality of cells.

3. The method of claim 2, wherein the plurality of first circuit paths are correspondingly combined by using the same name in the layout.

4. The method of claim 2, wherein the plurality of first circuit paths comprise a plurality of horizontal lines and a plurality of vertical lines;
   each of the plurality of cells are configured with the first node that is coupled to a respective one of the plurality of horizontal lines, and a second node that is coupled to a respective one of the plurality of vertically lines; and
   the first representative characteristic is coupling capacitance between the combined plurality of horizontal lines and the combined plurality of vertical lines averaged by the number of the plurality of cells.

5. The method of claim 1, wherein generating the universal cell model applied to each cell in a second array comprises:
   obtaining a coefficient matrix to be multiplied to a variable vector filled using the first array size configuration to approximate the first representative characteristic;
   obtaining a second approximated representative characteristic of the second array using the coefficient matrix and the variable vector filled using the second array size configuration, the second array size configuration being different from the first array size configuration; and
   applying the second approximated representative characteristic to the base cell model to generate the universal cell model.

6. The method of claim 5, wherein the variable vector comprises a plurality of first terms obtained using the first array size configuration of the first array, and a second term obtained using an area of the first array.

7. The method of claim 6, wherein the variable vector is normalized with respect to the area of the first array.

8. The method of claim 6, wherein the variable vector further comprises a constant term.

9. The method of claim 5, wherein the number of first arrays for which layouts are received is at least four;
   the at least four first arrays have different array size configurations; and
   the coefficient matrix obtained renders approximations to the first representative characteristics of the at least four first arrays having a smaller error.

10. A system for designing and implementing an integrated circuit, comprising:
    at least one processor, configured to execute program instructions which configure the at least one processor as:
       an extraction module configured to:
          receive, for each of at least a first array, a layout of the first array which comprises a plurality of cells, and a plurality of first circuit paths running across at least one side length in a first array size configuration of the first array, each of the plurality of cells being configured with a first node that is coupled to a respective one of the plurality of first circuit paths; and
          extract a first representative characteristic associated with the plurality of first circuit paths; and
       a universal cell model-generating module configured to generate a universal cell model applied to each cell in a second array based on a base cell model comprising parameters independent of positions in the second array, and the first representative characteristic, the second array having a second array size configuration the same as or different from the first array size configuration of the first array; and
    at least one memory configured to store the program instructions,
    wherein the at least one processor is configured to apply the universal cell model so as to effect a physical implementation of an integrated circuit.

11. The system of claim 10, wherein the plurality of first circuit paths are correspondingly combined according to respective connections to cells in the plurality of cells, and the first representative characteristic is a characteristic of the correspondingly combined plurality of first circuit paths averaged by a number of the plurality of cells.

12. The system of claim 11, wherein the plurality of first circuit paths are correspondingly combined by using the same name in the layout.

13. The system of claim 11, wherein the plurality of first circuit paths comprise a plurality of horizontal lines and a plurality of vertical lines;
    each of the plurality of cells are configured with the first node that is coupled to a respective one of the plurality of horizontal lines, and a second node that is coupled to a respective one of the plurality of vertical lines; and
    the first representative characteristic is coupling capacitance between the combined plurality of horizontal lines and the combined plurality of vertical lines averaged by the number of the plurality of cells.

14. The system of claim 10, wherein the universal cell model-generating module comprises:
    a coefficient matrix-obtaining module configured to obtain a coefficient matrix to be multiplied to an variable vector filled using the first array size configuration to approximate the first representative characteristic;
    an inter and/or extrapolation module configured to obtain a second approximated representative characteristic of the second array using the coefficient matrix and the variable vector filled using the second array size configuration, the second array size configuration being different from the first array size configuration; and a characteristic application module configured to apply the second approximated representative characteristic to the base cell model to generate the universal cell model.

15. The system of claim 14, wherein the variable vector comprises a plurality of first terms obtained using the first array size configuration of the first array, and a second term obtained using an area of the first array.

16. The method of claim 15, wherein the variable vector is normalized with respect to the area of the first array.

17. The system of claim 15, wherein the variable vector further comprise a constant term.

18. The system of claim 14, wherein the number of first arrays for which layouts are received is at least four;

the at least four first arrays have different array size configurations; and the coefficient matrix obtained renders approximations to the first representative characteristics of the at least four first arrays having a smaller error.

19. A method, performed by at least one processor, for designing and implementing an integrated circuit, the method comprising:

receiving, by the at least one processor, for each of at least a first array, a layout of the first array which comprises a plurality of cells, and a plurality of first circuit paths running across at least one side length in a first array size configuration of the first array, each of the plurality of cells being configured with a first node that is coupled to a respective one of the plurality of first circuit paths;

obtaining, by the at least one processor, a coefficient matrix to be multiplied to a variable vector filled using the first array size configuration;

obtaining, by the at least one processor, a second approximated representative characteristic of a second array using the coefficient matrix and the variable vector filled using a second array size configuration, the second array size configuration being different from the first array size configuration;

generating, by the at least one processor, a universal cell model applied to each cell in the second array by applying the second approximated representative characteristic to a base model, the base model comprising parameters independent of positions in the second array, and a first representative characteristic associated with the plurality of first circuit; and effecting a physical implementation of an integrated circuit based on the universal cell model.

20. The method of claim 19, wherein the plurality of first circuit paths are correspondingly combined according to respective connections to cells in the plurality of cells, and the first representative characteristic is a characteristic of the correspondingly combined plurality of first circuit paths averaged by a number of the plurality of cells.

* * * * *